(12) United States Patent
Choi et al.

(10) Patent No.: US 6,236,249 B1
(45) Date of Patent: May 22, 2001

(54) POWER-ON RESET CIRCUIT FOR A HIGH DENSITY INTEGRATED CIRCUIT

(75) Inventors: Soo-Hwan Choi; Jong-Mia Park, both of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/333,195

(22) Filed: Jun. 14, 1999

(30) Foreign Application Priority Data

Jun. 12, 1998 (KR) .................................................. 98-22099

(51) Int. Cl.[7] ...................................................... H03L 7/00
(52) U.S. Cl. ........................... 327/143; 327/198; 327/540
(58) Field of Search .................................... 327/142, 143, 327/198, 146, 540, 541

(56) References Cited

U.S. PATENT DOCUMENTS

| | | | |
|---|---|---|---|
| 4,885,476 | 12/1989 | Mahabadi | 327/143 |
| 4,970,408 | * 11/1990 | Hanke et al. | 327/143 |
| 5,177,375 | * 1/1993 | Ogawa et al. | 327/143 |
| 5,374,923 | * 12/1994 | Sakamoto | 327/143 |
| 5,376,835 | 12/1994 | Van Buskirk et al. | 327/143 |
| 5,386,152 | 1/1995 | Naraki | 327/143 |
| 5,463,335 | 10/1995 | Divakaruni et al. | 327/143 |
| 5,483,187 | * 1/1996 | Jang | 327/143 |
| 5,570,050 | * 10/1996 | Conary | 327/143 |
| 5,612,642 | 3/1997 | McClintock | 327/143 |
| 5,734,280 | * 3/1998 | Sato | 327/143 |
| 5,760,624 | 6/1998 | McClintock | 327/143 |
| 5,883,532 | * 3/1999 | Bowers | 327/143 |
| 6,005,423 | * 12/1999 | Schultz | 327/143 |

* cited by examiner

*Primary Examiner*—Kenneth B. Wells
*Assistant Examiner*—An T. Luu
(74) *Attorney, Agent, or Firm*—Marger Johnson & McCollom, P.C.

(57) ABSTRACT

A power-on reset circuit reduces power consumption and layout area by utilizing a time delay to deactivate a reset circuit and clamp a reset signal a period of time after a power supply voltage has reached a predetermined level. The reset circuit includes a reset signal generator which maintains the reset signal in an active state until the power supply voltage has reached the predetermined level. The reset signal generator then deactivates the reset signal which causes a delay circuit to begin a time delay after which a delay signal is asserted. The delay signal deactivates a comparator in the reference voltage generator, a voltage detector, and a reset signal generator within the reset circuit, thereby reducing power consumption. The delay signal also activates a clamp circuit which clamps the reset signal to an inactive state.

10 Claims, 2 Drawing Sheets

POWER-ON RESET CIRCUIT FOR A HIGH DENSITY INTEGRATED CIRCUIT

This application corresponds to Korean patent application No. 98-22099 filed Jun. 12, 1998 in the name of Samsung Electronics Co., Ltd., which is herein incorporated by reference for all purposes.

BACKGROUND OF THE INVENTION

1. Field of the Invention

The present invention relates to power-on reset circuits for integrated circuits and, more particularly, to a power-on reset circuit suitable for high density integrated circuits.

2. Description of the Related Art

A power-on reset circuit (sometimes called a power up detection circuit) provides a reset signal for initializing flip-flops, latches, counters, registers and other such internal components of a semiconductor integrated circuit, when power is applied thereto. The reset signal is maintained at a first constant voltage (e.g., a logic low or "0") for a sufficient time to allow stabilization of the respective components of the circuit. After a predetermined time, the reset signal is switched to a second constant voltage e.g., a logic high or "1") for as long as the power is applied to the circuit.

A large variety of power-on reset circuits have been proposed, such as U.S. Pat. No. 4,885,476, by Mahabadi, issued on Dec. 5, 1989, disclosing a power-on reset circuit including a start-up voltage generator circuit which produces a voltage which is insensitive to changes in field effect transistor threshold voltages, in which a reset signal is fed back to the start-up voltage generator circuit to reduce the steady state current.

U.S. Pat. No. 5,386,152, by Naraki, Jan. 31, 1995, discloses a reset signal generating circuit which generates and provides a reset signal for a logic unit during a certain period only when a power component from the output of a differentiator circuit exceeds a threshold voltage of the reset signal generating circuit.

U.S. Pat. No. 5,463,335, by Divakaruni et al., issued on Oct. 31, 1995, teaches a power-on reset circuit which includes an output terminal connected through an impedance to a power supply, with the output terminal being further connected through a subthreshold leakage device for a latch to a point of reference potential, the subthreshold leakage device being switched from an initial subthreshold mode to a conduction mode in response to a predetermined level of output voltage developed on the output terminal.

U.S. Pat. Nos. 5,612,642 and 5,760,624, by McClintock, issued on Mar. 26, 1997 and Jun. 2, 1998, respectively, disclose power-on reset circuits each of which deasserts a power on reset signal until the power supply voltage level drops to a level low enough to render storage elements in a circuit controlled by the reset signal incapable of holding accurate data.

When designing power-on reset circuits, consideration must be given to steady-state power dissipation, chip layout, production costs and the stability of the reset signal. In designing a typical power-on reset circuit, the steady-state power dissipation should be minimized. In addition, to economize the layout area of the chip, the use of passive elements (e.g., capacitors and resistors) which occupy a relatively large area, and depletion mode transistors which add a manufacturing step, should be avoided.

With reference to FIG. 1, there is illustrated a conventional monolithic semiconductor integrated circuit chip with a power-on reset circuit 12, which is disclosed in U.S. Pat. No. 5,376,835, by Van Buskirk et al., issued on Dec. 27, 1994. The power-on reset circuit 12 illustrated in FIG. 1 may be designed so as to be incorporated into a semiconductor chip along with logic and/or memory circuitry 18 and a voltage reference generator 38. The power-on reset circuit 12 provides a reset signal VCCOK on its first output terminal 14 which is coupled vial line 16 to logic and/or memory circuitry 18 containing a state machine having state registers SR1, SR2, . . . , SRn. The reset signal VCCOK is a logic signal which resets the state registers SR1, SR2, . . . , SRn when it is at a low or "0" logic level (active state).

The true outputs Q1 through Qn of the respective registers SR1 through SRn are connected to corresponding inputs of a NOR gate 20 via lines 22a–22n, respectively. The output of the logic gate 20 on line 24 is fed to an inverter gate 26 on line 28 which provides a state monitoring signal SMON which is connected to a first input terminal 32 of the power-on reset circuit 12.

The power-on reset circuit 12 includes a second output terminal 34 which provides a logic control signal VON which is fed via line 35 to an input terminal 36 of the voltage reference generator 38. The voltage reference generator 38 generates a stable reference voltage VREFI on its first output terminal 40 which is fed via line 42 to a second input terminal 44 of the power-on reset circuit 12. The reference generator 38 also provides a start-up voltage VCCDC on its second output terminal 46 which is fed via line 48 to a third input terminal 50 of the power-on reset circuit 12.

The power-on reset circuit 12 operates in response to the monitoring signal SMON, the start-up voltage VCCDV, and the reference voltage VREFI, and generates and maintains the reset signal VCCOK at an active low state during power-up until the power supply voltage exceeds a predetermined level. More specifically, the power-on reset circuit 12 is active during power-up only if one of the outputs of the state registers SR 1–SRn is high (i.e., in the non-reset state). Otherwise, if the outputs of the state registers SR 1–SRn happen to come up in the reset state (all outputs being low), then the power-on reset circuit 12 is never activated at all since the logic control signal VON remains low. When the state registers SR1–SRn are powered up in the non-reset state, the reset signal VCCOK continues to be applied to the reset inputs of the state registers SR 1–SRn until the power supply voltage VCC has reached a predetermined level so as to insure proper operation of the logic and/or memory circuitry 18. Thereafter, the power-on reset circuit 12 shuts itself off in response to the monitoring signal SMON, thereby reducing power consumption.

However, the above-described arrangement, in which the outputs of the state registers SR1–SRn are used for shutting off the power-on reset circuit 12 through logic gates 20 and 24, requires a considerable increase in the layout area for the power-on reset circuit as the number of the state registers increases because the number of logic gates must necessarily increase due to limitations on logic circuit construction such as fan-in. Therefore, the density of an integrated circuit chips having the above-described arrangement is reduced.

SUMMARY OF THE INVENTION

An object of the present invention, accordingly, is to overcome the drawbacks of prior art power-on reset circuits, and to provide a power-on reset circuit suitable for high integration density integrated circuits.

It is another object of the present invention to provide a power-on reset circuit having a small layout area.

These and other objects, features and advantages of the present invention are provided by a power-on reset circuit which includes a reset circuit that generates a reset signal and a delay circuit that generates a delay signal which is a delayed version of the reset signal. The reset signal is maintained in a first logic state (e.g., logic 0) until the power supply voltage has reached a predetermined level (e.g., about 2 volts). The reset circuit is deactivated in response to the delay signal so that the reset signal is maintained in a second logic state (e.g., logic 1). The delay circuit preferably provides a delay time ranging from several tens of microseconds to several milliseconds. Specifically, the reset circuit includes a reference voltage generator which generates a reference voltage, a voltage detector which generates a start-up voltage proportional to the power supply voltage, and a reset signal generator which generates the reset signal in response to the reference voltage and the start-up voltage. The reset signal generator includes a differential comparator which generates the reset signal at a first logic state while the start-up voltage is smaller than or equal to the reference voltage, and a clamp circuit which clamps the reset signal to a second logic state in response to the delay signal.

The foregoing features and advantages of the invention will be more fully described in the accompanying drawings.

DETAILED DESCRIPTION

The present invention relates to an improved power-on reset circuit which can be incorporated into a high density integrated circuit. In the following description, specific details are set forth to provide a thorough understanding of the present invention. However, it will be apparent to those skilled in the art that the present invention may be practiced without these particulars. Accordingly, the specification and a drawing are to be regarded in an illustrative, rather than a restrictive sense.

A preferred embodiment of the present invention will now be described with reference to FIG. 2 of the drawings.

Figure 2:
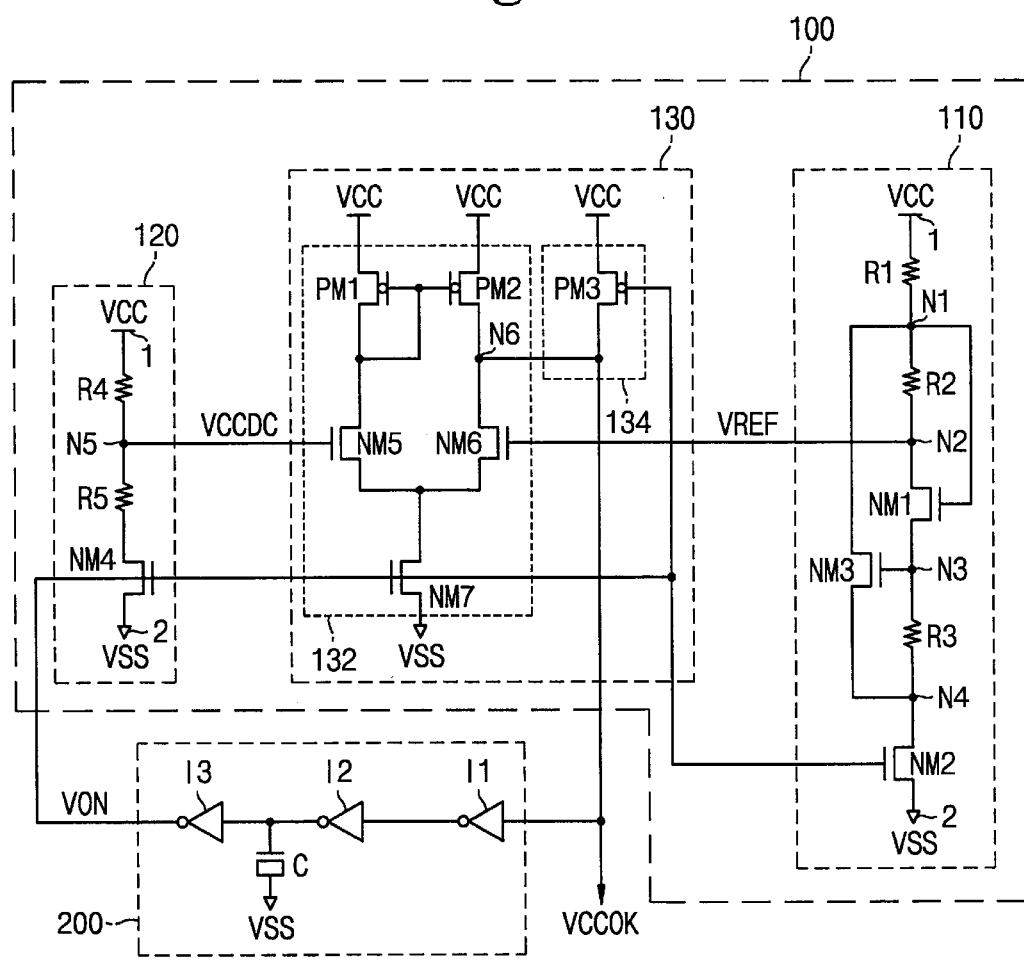
FIG. 2 is a circuit diagram of a preferred embodiment of a power-on reset circuit according to the present invention.

Referring to FIG. 2, the power-on reset circuit includes a reset circuit 100 and a delay circuit 200. The reset circuit 100 generates a power-on reset signal VCCOK at a first state (e.g., a logic "low" or "0") until the power supply voltage VCC has reached a predetermined level (e.g., about 2.26 volts). The delay circuit 200 generates a delay signal VON which is a delayed and inverted version of the reset signal VCCOK. The delay circuit provides a delay time ranging from several tens of microseconds (e.g. 10 microseconds) to several milliseconds (e.g., 1 milliseconds). The reset circuit 100 is deactivated in response to the delay signal VON from the delay circuit 200 so that the reset signal VCCOK is maintained in a second logic state (e.g., a logic "high" or "1" state).

The reset circuit 100 includes a reference voltage generator 110 which generates a reference voltage VREF (e.g., 1.2 volts), a power supply voltage detector 120 which generates a start-up voltage VCCDC proportional to the power supply voltage VCC, and a reset signal generator 130 which generates the reset signal VCCOK in response to the reference voltage VREF and the start-up voltage VCCDC.

More specifically, the reference voltage generator 110 includes three NMOS transistors NM1, NM2 and NM3, each of which has a controlling electrode (i.e., gate electrode) and a pair of controlled electrodes (i.e., source/drain electrodes). The reference voltage generator 110 is also provided with three resistors R1, R2 and R3. The resistors R1 and R2, the drain and source electrodes of the NMOS transistor NM1, the resistor R3, and the drain and source electrodes of the NMOS transistor NM2 are serially connected between the power supply terminal VCC (first power supply voltage) and the ground terminal VSS (second power supply voltage) in the order recited so as to define a first node N1 between the resistors R1 and R2, a second node N2 (i.e., reference voltage output node VREF) between the resistor R2 and the transistor NM1, a third node N3 between the transistor NM1 and the resistor R3, and a fourth node N4 between the resistor R3 and the transistor NM2. Specifically, the gate electrodes of the NMOS transistors NM1 and MN3 are coupled to the first and third nodes N1 and N3, respectively. Further, the source and drain electrodes of the transistor NM3 are connected to the first and fourth nodes N1 and N4, respectively.

Resistor R3 sets the gate-to-source voltage of NMOS transistor NM3 so that the NMOS transistor NM3 conducts in its subthreshold region. Thus, NMOS transistor NM3 has a negative temperature coefficient. In contrast, NMOS transistor NM1 has a positive temperature coefficient in its conduction region.

The operation of the reference voltage generator 110 will now be described with reference to FIG. 2. As the power supply voltage VCC increases, the voltage at node N1 (the gate voltage of NMOS transistor NM1) increases, and the amount of current flowing through resistor R2 increases. The increase in gate voltage of NMOS transistor NM3 due to the higher voltage at node N3 causes an increase in the current flowing through NMOS transistor NM3. Thus, the voltage at node N1 decreases, and current flowing through the resistor R2 is reduced, which causes the drain-to-source current of NMOS transistor NM1 to decrease. As a result, reference voltage VREF remains relatively constant despite an increase in the power supply voltage VCC.

Conversely, when the first power supply voltage VCC decreases, the reduced voltage level at node N1 decreases the current that flows through the resistor R2. The voltage at node N3 and the reference voltage VREF also decrease. However, as the voltage of node N3, corresponding to the gate voltage of NMOS transistor NM3, is reduced, the voltage at node N1 increases, and the current flowing through the NMOS transistor NM1 increases.

Thus, the NMOS transistors NM1 and NM3 adjust to changes in the power supply voltage VCC in a complementary manner, so that the reference voltage VREF is relatively insensitive to power supply voltage variations. Stated differently, NMOS transistor NM1 controls the voltage level at node N2 and NMOS transistor NM3 controls the voltage level at node N1, so that the reference voltage at node N2 is relatively stable notwithstanding changes in the power supply voltage VCC.

As described above, the reference voltage generator 110 provides a stable reference voltage VREF (e.g., about 1.2 volts for a VCC of about 3 volts) that is relatively insensitive to variations in the threshold voltages of the transistors therein. The reference voltage generator 110 is also relatively insensitive to variations in power supply voltage VCC and temperature.

The power supply voltage generator 120 includes two serially connected resistors R4 and R5 acting as a voltage divider, and an NMOS transistor NM4 having a controlling electrode (i.e., gate electrode) and a pair of controlled electrodes (i.e., source and drain electrodes). The resistors R4 and R5 and the drain and source electrodes of the transistor NM4 are connected in series between the first and second power supply voltages VCC and VSS in the order recited so as to define a node N5 (i.e., start-up voltage output node VCCDC) between the resistors R4 and R5. When transistor NM4 is turned on, the power supply voltage VCC is divided by resistors R4 and R5 so as to obtain the start-up voltage VCCDC at node N5.

The reset signal generator 130 includes a differential amplifier 132 serving as a comparator. The differential amplifier 132 includes two PMOS transistors PM1 and PM2 and three NMOS transistors NM5, NM6 and NM7, each of which has a controlling electrode (i.e., gate electrode) and a pair of controlled electrodes (i.e., source and drain electrodes). The source electrodes of the PMOS transistors PM1 and PM2 are commonly connected to the first power supply terminal VCC and the gate electrodes thereof are connected to each other. Also, the gate electrodes of the PMOS transistors PM1 and PM2 are commonly connected to the drain electrodes of the PMOS transistor PM1 and NMOS transistor NM5. The drain electrodes of the PMOS transistor PM2 and NMOS transistor NM6 are connected to each other. The source electrodes of the NMOS transistors NM5 and NM6 are connected to the drain of the NMOS transistor NM7. The source electrode of the NMOS transistor NM7 is connected to the second power supply terminal VSS (i.e., the ground voltage). The differential amplifier 132 generates the reset signal VCCOK at a low state while the start-up voltage VCCDC is lower than or equal to the reference voltage VREF.

The trip voltage of the differential amplifier 132 can be obtained by following equation:

$$VCCDC=VREF \quad (1)$$

where $VCCDC=VCC \times (R5/(R4+R5))$. Assuming the ratio $R5/(R4+R5)=0.53$ and VREF=1.2 volts, equation (1) can be rewritten as follows:

$$VCC \times 0.53 = 1.2 \text{ volts} \quad (2)$$

Solving equation (2) for VCC, we have:

$$VCC=1.2 \text{ volts}/0.53=2.26 \text{ volts} \quad (3)$$

Accordingly, when the power supply voltage VCC is less than about 2.26 volts, the reset signal VCCOK remains low.

The reset signal generator 130 further includes a clamp circuit 134. This circuit 134 includes a PMOS transistor PM3 whose source electrode is connected to the first power supply terminal VCC and whose drain is connected to both drain electrodes of the transistors PM2 and NM2 (i.e., node N6), respectively. The clamp circuit 134 clamps the reset signal VCCOK to a voltage of the logic high state (i.e., VCC) in response to the delay signal VON.

The delay circuit 200 includes a capacitor C and an odd number of serially connected inverters, for example, three inverters I1, I2 and I3. The first inverter I1 has its input connected to the node N6 (i.e., reset signal output node) of the reset signal generator 110. The last inverter I3 has its output commonly connected to the gate electrodes of the transistors NM4, NM7, NM2 and PM3.

The operation of the power-on reset circuit of the invention will now be described in more detail. The differential amplifier 132 initially maintains the reset signal VCCOK at the low state. This forces the delay signal VON from the delay circuit 200 remain high. The high state of the delay signal VON renders the transistors NM2, NM4 and NM7 conductive. Also, the high state of the VON signal makes the transistor PM3 nonconductive. As the power supply voltage VCC ramps up towards the steady-state level of approximately 3 volts after power-on, the reference voltage VREF and the start-up voltage VCCDC follow the power supply voltage VCC. When the power supply voltage VCC reaches about 2.26 volts, the reference voltage VREF and the start-up voltage VCCDC will be about 1.2 volts. At this time, the reset signal VCCOK is still maintained in the low state. Thereafter, when the startup voltage VCCDC goes beyond 1.2 volts with the continuous ramp up of the power supply voltage VCC, the reset signal VCCOK goes high since the reference voltage VREF is maintained at a constant level of about 1.2 volts as mentioned earlier. After a given delay time (e.g., several tens of microseconds through several milliseconds) from the low-to-high transition of the reset signal VCCOK, the delay signal VON from the delay circuit 200 goes low. This makes the NMOS transistors NM2, NM4 and NM7 nonconductive, resulting in the automatic deactivation of the reference voltage generator 110, the power supply voltage detector 120 and the differential amplifier 132, thereby reducing power consumption. Also, the low state of the signal VON makes the PMOS clamp transistor PM3 conductive so that the VCCOK signal is clamped to the power supply voltage VCC, i.e., logic high state.

Figure 1:
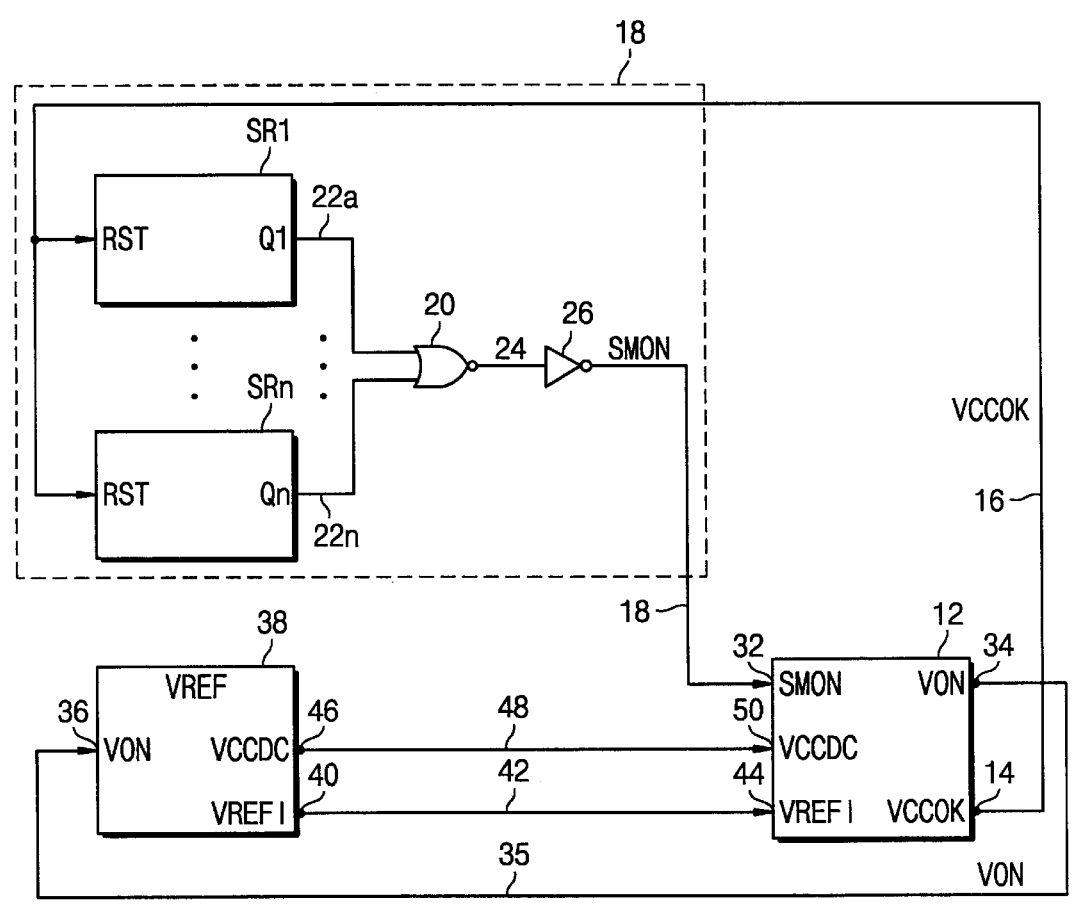
FIG. 1 is a block diagram of a prior art monolithic semiconductor integrated circuit chip which includes a power-on reset circuit.

Based on the above, it can be appreciated that a power-on reset circuit according to the present invention occupies a small area compared to the prior art circuit shown in FIG. 1, since a circuit according to the invention needs no logic gates for checking the outputs of the status registers. Accordingly, the power-on reset circuit of the invention is suitable for high density integrated circuits.

Numerous modifications and variations of the present invention are possible in light of the above teachings. It is therefore to be understood that, within the scope of the appended claims, the present invention can be practiced in a manner other than as specifically described herein. We claim all modifications and variations coming within the spirit and scope of the following claims.

What is claimed is:

1. A power-on reset circuit for an integrated circuit comprising:

a reset circuit for generating a reset signal at a first logic state until a power supply voltage has reached a predetermined level; and a delay circuit coupled to the reset circuit for generating a delay signal responsive to the reset signal;

wherein the reset circuit generates the reset signal at a second logic state in response to the delay signal;

wherein said reset circuit comprises:

a reference signal generator for generating a reference signal;

a voltage detector coupled to the reference signal generator for generating a start-up signal responsive to the power supply voltage; and a reset signal generator coupled to the reference signal generator and the voltage detector for generating the reset signal in response to the reference signal and the start-up signal; and wherein said reset signal generator comprises:

a differential comparator for generating the reset signal at the first logic state while the start-up signal is lower than or equal to the reference signal; and a clamp circuit coupled to the differential comparator for clamping the reset signal to the second logic state in response to the delay signal.

2. A power-on reset circuit for an integrated circuit comprising:
- a reference voltage generator coupled between first and second power supply terminals for generating a reference voltage;
- a voltage detector coupled between the first and second power supply terminals for generating a start-up voltage proportional to the voltage at the first power supply terminal;
- a reset signal generator coupled to the reference voltage generator and the voltage detector for generating a reset signal in response to the reference voltage and the start-up voltage, the reset signal being maintained in a first logic state until the first power supply voltage has reached a predetermined level; and
- a delay circuit for generating a delay signal responsive to the reset signal;
- wherein the reset signal generator is deactivated in response to the delay signal such that the reset signal is maintained in a second logic state;
- wherein said reference voltage generator comprises:
  - first through third resistors; and
  - first through third transistors, each having a controlling electrode and a pair of controlled electrodes; and
- wherein the first resistor is coupled between the first power supply terminal and a first node, the second resistor is coupled between the first node and a second node which provides the reference voltage, the controlled electrodes of the first transistor are coupled between the second and a third node, the third resistor is coupled between the third node and a fourth node, the controlled electrodes of the second transistor are coupled between the fourth node and the second power supply terminal, the controlled electrodes of the third transistor are coupled between the first and fourth nodes, the controlling gate of the first transistor is coupled to the first node, the controlling gate of the second transistor is coupled to receive the delay signal, and the controlling gate of the third transistor is coupled to the third node, respectively.

3. A power-on reset circuit for an integrated circuit comprising:
- a reference voltage generator coupled between first and second power supply terminals for generating a reference voltage;
- a voltage detector coupled between the first and second power supply terminals for generating a start-up voltage proportional to the voltage at the first power supply terminal;
- a reset signal generator coupled to the reference voltage generator and the voltage detector for generating a reset signal in response to the reference voltage and the start-up voltage, the reset signal being maintained in a first logic state until the first power supply voltage has reached a predetermined level; and
- a delay circuit for generating a delay signal responsive to the reset signal;
- wherein the reset signal generator is deactivated in response to the delay signal such that the reset signal is maintained in a second logic state;
- wherein said voltage detector comprises:
  - first and second resistors; and
  - a transistor having a controlling electrode and a pair of controlled electrodes; and
- wherein the first resistor is coupled between the first power supply terminal and a node which provides the start-up voltage, the second resistor and the controlled electrodes of the transistor are serially coupled between the node and the second power supply terminal, and the controlling electrode of the transistor is coupled to receive the delay signal.

4. A power-on reset circuit or an integrated circuit comprising:
- a reference voltage generator coupled between first and second power supply terminals for generating a reference voltage;
- a voltage detector coupled between the first and second power supply terminals for generating a start-up voltage proportional to the voltage at the first power supply terminal;
- a reset signal generator coupled to the reference voltage generator and the voltage detector for generating a reset signal in response to the reference voltage and the start-up voltage, the reset signal being maintained in a first logic state until the first power supply voltage has reached a predetermined level; and
- a delay circuit for generating a delay signal responsive to the reset signal;
- wherein the reset signal generator is deactivated in response to the delay signal such that the reset signal is maintained in a second logic state;
- wherein said reset signal generator comprises:
  - a differential comparator having a first input terminal for receiving the start-up voltage, a second input terminal for receiving the reference voltage, and an output terminal for generating the reset signal, wherein the differential comparator generates the reset signal at the first logic state while the start-up voltage is lower than or equal to the reference voltage; and
  - a clamp circuit coupled to the output terminal of the differential comparator for clamping the reset signal to the second logic state in response to the delay signal.

5. A method for generating a reset signal for an integrated circuit comprising:
- maintaining the reset signal at a first logic state until a power supply voltage reaches a predetermined level;
- switching the reset signal to a second logic state when the power supply voltage has reached the predetermined level;
- delaying the reset signal for a period of time after the supply voltage reaches the predetermined level;
- clamping the reset signal to the second logic state after the time delay; and deactivating a comparator after the time delay.

6. A method for generating a reset signal for an integrated circuit comprising:
- maintaining the reset signal at a first logic state until a power supply voltage reaches a predetermined level;
- switching the reset signal to a second logic state when the power supply voltage has reached the predetermined level;
- delaying the reset signal for a period of time after the supply voltage reaches the predetermined level;
- clamping the reset signal to the second logic state after the time delay; and deactivating a reference signal generator after the time delay.

7. A method for generating a reset signal for an integrated circuit comprising:
- maintaining the reset signal at a first logic state until a power supply voltage reaches a predetermined level;
- switching the reset signal to a second logic state when the power supply voltage has reached the predetermined level;
- delaying the reset signal for a period of time after the supply voltage reaches the predetermined level;
- clamping the reset signal to the second logic state after the time delay; and deactivating a voltage detector after the time delay.

8. A method for generating a reset signal for an integrated circuit comprising:
- maintaining the reset signal at a first logic state until a power supply voltage reaches a predetermined level;
- switching the reset signal to a second logic state when the power supply voltage has reached the predetermined level;
- delaying for a period of time after the supply voltage reaches the predetermined level; and
- clamping the reset signal to the second logic state after the time delay;
- wherein delaying for a period of time includes generating a delay signal responsive to the reset signal; and
- wherein the reference signal is generated by a reference signal generator having a comparator, and further including deactivating the comparator responsive to the reset signal after the time delay.

9. A method as set forth in claim 8 wherein the comparator generates the reset signal responsive to a reference signal from a reference signal generator and a start-up signal from a voltage detector, and further including deactivating the reference signal generator and the voltage detector responsive to the reset signal after the time delay.

10. A method as set forth in claim 8 wherein the reset signal is clamped by a clamp circuit, and further including activating the clamp circuit responsive to the reset signal after the time delay.

* * * * *

UNITED STATES PATENT AND TRADEMARK OFFICE
CERTIFICATE OF CORRECTION

PATENT NO.    : 6,236,249 B1
DATED         : May 22, 2001
INVENTOR(S)   : Soo-Hwan Choi et al.

It is certified that error appears in the above-identified patent and that said Letters Patent is hereby corrected as shown below:

Column 5,
Line 62, "13" should read -- I3 --;

Column 8,
Line 10, "reset circuit or" should read -- reset circuit for --;

Signed and Sealed this

Eleventh Day of June, 2002

Attest:

Attesting Officer

JAMES E. ROGAN
Director of the United States Patent and Trademark Office